United States Patent [19]
Levitt et al.

[11] Patent Number: 5,864,564
[45] Date of Patent: Jan. 26, 1999

[54] CONTROL CIRCUIT FOR DETERMINISTIC STOPPING OF AN INTEGRATED CIRCUIT INTERNAL CLOCK

[75] Inventors: Marc E. Levitt, Sunnyvale; Harsimran Singh Grewal, Palo Alto, both of Calif.

[73] Assignee: Sun Microsystems, Inc., Mountain View, Calif.

[21] Appl. No.: 560,318

[22] Filed: Nov. 17, 1995

[51] Int. Cl.$^6$ .................................................. G01R 31/28
[52] U.S. Cl. ........................ 371/22.3; 371/61; 327/232; 327/156
[58] Field of Search .............................. 371/22.3, 20.4, 371/28; 307/269; 395/550; 327/160, 232, 236, 156, 242–244

[56] References Cited

U.S. PATENT DOCUMENTS

| | | | |
|---|---|---|---|
| 5,087,829 | 2/1992 | Ishibashi et al. | 307/269 |
| 5,289,050 | 2/1994 | Ogasawara | 307/480 |
| 5,394,024 | 2/1995 | Buckenmaier et al. | 327/160 |
| 5,442,773 | 8/1995 | Oto | 395/550 |
| 5,455,931 | 10/1995 | Camporese et al. | 395/550 |

OTHER PUBLICATIONS

Holdbrook, et al, "MicroSparc: A Case Study of Scan Based Debug", International Test Conference Washington, D.C., Oct. 1944, pp. 70–75.

IEEE Standard Test Access Port and Boundary Scan Architecture, IEEE Std. 1149.1–1990.

Hao, Hong et al U. S. Application Ser. No. 08/379,159, filed Jan. 27, 1995 for Method and Apparatus for Fully Controllable Integrated Circuit Internal Clock.

Holdbrook et al. "microSparc: A case study of scan based debug", ITC, pp. 70–75; Oct. 1994.

*Primary Examiner*—Robert W. Beausoliel, Jr.
*Assistant Examiner*—Nadeem Iqbal
*Attorney, Agent, or Firm*—Flehr Hohbach Test Albritton & Herbert; William S. Galliani

[57] ABSTRACT

A control circuit to stop an integrated circuit internal clock includes a signal distribution trace connected to a clock stop pipeline. The signal distribution trace creates a large phase delay signal for a first integrated circuit internal clock cycle which activates the clock stop pipeline, and a small phase delay signal for a final integrated circuit internal clock cycle that deactivates the clock stop pipeline. The clock stop pipeline includes a first circuit component to generate an intermediate stop instruction in response to a clock stop command and the large phase delay signal of the first integrated circuit internal clock cycle. The intermediate stop instruction proceeds through the clock stop pipeline in response to clock cycles following the first clock cycle. The clock stop pipeline includes a final circuit component to produce a final stop instruction when the intermediate stop instruction and the small phase delay signal of the final integrated circuit internal clock cycle are received at the final circuit component. The final stop instruction is used to lock the integrated circuit internal clock in a single digital state.

19 Claims, 3 Drawing Sheets

CONTROL CIRCUIT FOR DETERMINISTIC STOPPING OF AN INTEGRATED CIRCUIT INTERNAL CLOCK

BRIEF DESCRIPTION OF THE INVENTION

This invention relates generally to the debugging of integrated circuits by stopping and starting integrated circuit internal clocks. More particularly, this invention relates to a control circuit for deterministicly stopping an integrated circuit internal clock during a selected clock state.

BACKGROUND OF THE INVENTION

It is difficult to test very large scale integrated (VLSI) circuits. Nevertheless, it is essential to verify that such circuits function properly. The internal clock is one of the most important components of any synchronous VLSI circuit. A fully controllable integrated circuit internal clock is very important when debugging a VLSI circuit. By manipulating the internal clock in different ways, the circuit can be controlled to run in different modes and at different speeds during debug operations. These modes can be used either on a tester or in a system environment. Critical information about the state of the integrated circuit is obtained from clock manipulation of this type.

Integrated circuit internal clocks are commonly operated in accordance with a boundary scan test method. In the boundary scan test method, test data is serially loaded into locations within the integrated circuit and then the integrated circuit executes logical operations on the serially loaded data. The resultant output data is then verified for accuracy. The most prevalent boundary scan test method is described in "IEEE Standard Test Access Port and Boundary-Scan Architecture", IEEE STD 1149.1–1990 (referred to herein as IEEE 1149).

In IEEE 1149, it is specified that the clock must be capable of being stopped indefinitely in a selected state, without causing any change to the state of the test logic. The clock is stopped, for example, when a test system needs to fetch data from backup memory.

As VLSI circuits grow in size and increase in speed, the length of the signal distribution network that a clock signal must traverse also grows. In some cases, a clock signal phase displacement of over one-half cycle can exist between the input node and the output node of the signal distribution network. In such a case, it is difficult to coordinate a stop clock command with a clock signal. If such coordination cannot be insured, then the clock signal cannot be deterministicly stopped at a selected signal transition. As a result, it is difficult to capture certain error states in an integrated circuit. Thus, debugging operations are compromised.

In view of the foregoing, it would be highly desirable to provide a control circuit to deterministicly stop an integrated circuit internal clock. More particularly, it would be highly desirable to provide such a control circuit for integrated circuits with signal distribution networks with a clock signal phase displacement of over one-half cycle.

SUMMARY OF THE INVENTION

A control circuit to stop an integrated circuit internal clock includes a signal distribution trace connected to a clock stop pipeline. The signal distribution trace creates a large phase delay signal for a first integrated circuit internal clock cycle which initiates processing in the clock stop pipeline, and a small phase delay signal for a final integrated circuit internal clock cycle that triggers the clock stop pipeline output. The clock stop pipeline includes a first circuit component to generate an intermediate stop instruction in response to a clock stop command and the large phase delay signal of the first integrated circuit internal clock cycle. The intermediate stop instruction proceeds through the clock stop pipeline in response to clock cycles following the first clock cycle. The clock stop pipeline includes a final circuit component to produce a final stop instruction when the intermediate stop instruction and the small phase delay signal of the final integrated circuit internal clock cycle are received at the final circuit component. The final stop instruction is used to lock the integrated circuit internal clock in a single digital state.

The internal clock can be viewed as proceeding through the signal distribution trace in a first direction and the intermediate stop instruction can be viewed as proceeding through the clock stop pipeline in a second direction. Since the progress of the intermediate stop instruction in the second direction is coordinated by the progress of the internal clock in the first direction, the final stop instruction can be deterministicly associated with a specific clock signal state. That is, the control circuit of the invention can insure that the stop clock instruction state (e.g., a digital ONE) is initiated during a specific clock state (e.g., a digital ONE). This ability is indispensable when debugging an integrated circuit with a signal distribution network that is longer than one-half cycle of the integrated circuit internal clock. In the absence of the invention, such circuits may experience a disruptive signal transition (e.g., from a digital ZERO to a digital ONE) when the final stop instruction is received, instead of the uniform stop clock instruction state (e.g., a continuous digital ONE) provided by the invention.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
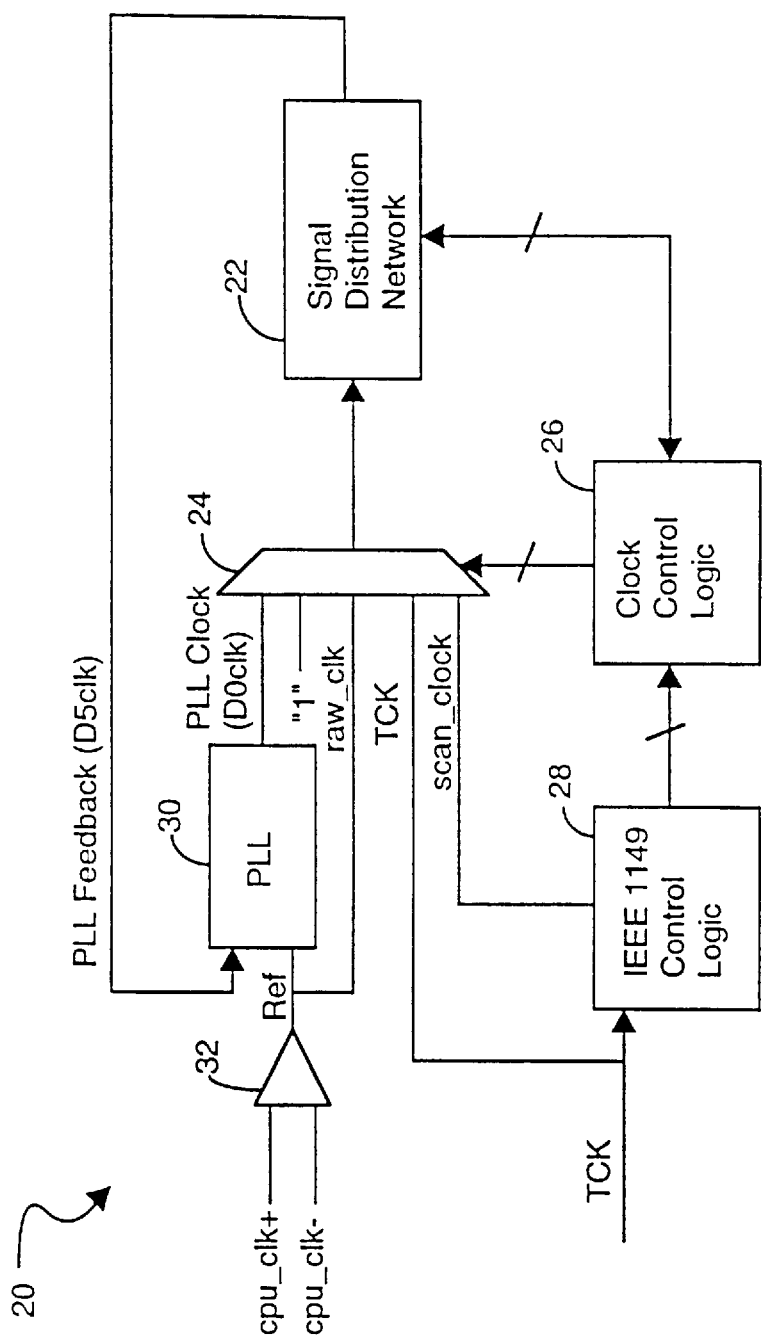
FIG. 1 illustrates an integrated circuit clock controller formed in accordance with one embodiment of the invention.

FIG. 1 illustrates an integrated circuit clock controller 20. The clock controller 20 supplies a clock signal to a signal distribution network 22. The signal distribution network 22 refers to the various paths that a clock signal follows on an integrated circuit. Thus, the signal distribution network 22 encompasses the logic circuitry of an integrated circuit.

The signal that is applied to the signal distribution network 24 is selected with a clock selection multiplexer 24. The clock selection multiplexer 24 is controlled by clock control logic 26. The clock control logic 26 receives instructions from the IEEE 1149 control logic 28. In the alternative, the clock control logic 26 may receive instructions generated by the signal distribution network 22 or instructions generated external to the chip.

The clock selection multiplexer 24 can select a variety of clock signals. As shown in FIG. 1, one input to the clock selection multiplexer 24 is the phase locked loop (PLL) clock. As known in the art, the PLL clock is generated by a phase locked loop (PLL) 30. One input to the PLL 30 is a reference clock. The reference clock is generated by an off-chip CPU clock, whose high (cpu_clk+) and low (cpu_clk-) signal transitions may be applied to an amplifier 32 to produce the reference clock input for the PLL 30. The other input to the PLL 30 is the PLL feedback signal, which is the clock signal that has passed through the signal distribution network 22.

Another input to the clock selection multiplexer 24 is a constant clock signal, specified in FIG. 1 as a digital ONE signal ("1"). The constant clock signal is the signal that the signal distribution network 22 receives when the integrated circuit clock is in a stop state.

Another input to the clock selection multiplexer 24 is a "raw_clk", which is the same as the reference signal into the PLL 30. The clock selection multiplexer 24 also receives debugging clock signals. These signals include the TCK signal, which is specified in IEEE 1149 as a controlled clock source. A "scan_clock" derived by the IEEE 1149 control logic 28 from the TCK signal may also be applied to the clock selection multiplexer 24.

The use of a clock selection multiplexer 24 to select a number of possible input clocks is known in the art. Similarly, the use of IEEE 1149 control logic 28 is known in the art. IEEE 1149 control logic 28 is used in the prior art to establish a constant clock signal when the integrated circuit clock is in a stop state for debug operations. Other techniques may be used to establish a stop state of an integrated circuit clock. The patent application entitled "Method and Apparatus for Fully Controllable Integrated Circuit Internal Clock", Ser. No. 08/379,159, filed Jan. 27, 1995, discloses an example of a clock controller circuit that can stop an integrated circuit internal clock within one clock cycle. That application is expressly incorporated by reference herein.

The present invention may be incorporated into known clock control circuit topologies. The invention requires additional circuitry to known signal distribution networks 22 and known clock control logic 26. In particular, the signal distribution network 22 is modified to incorporate a signal distribution trace in accordance with the invention. In addition, the clock control logic 26 is modified to incorporate a clock stop pipeline in accordance with the invention. These novel elements are illustrated in FIG. 2.

Figure 2:
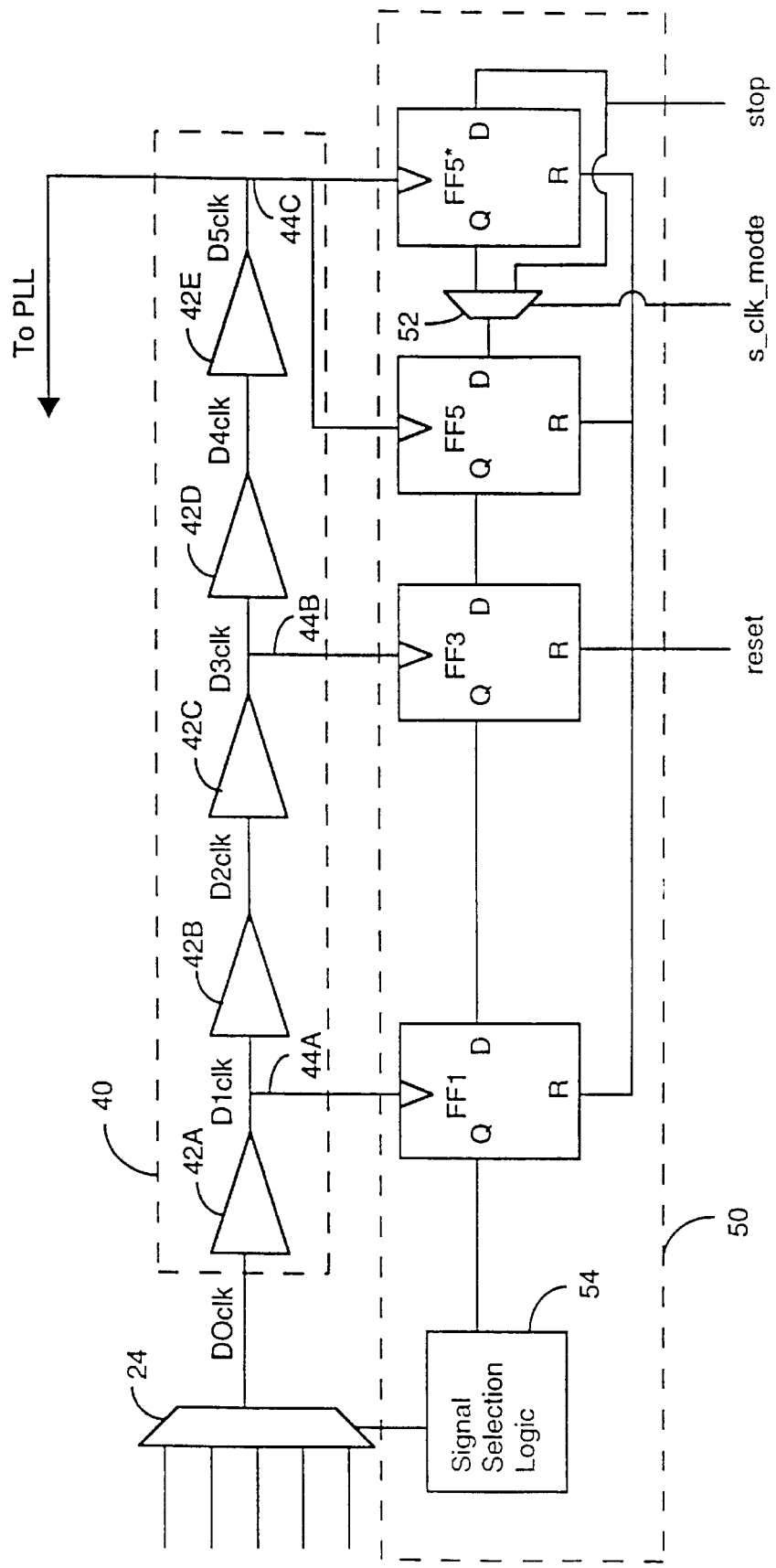
FIG. 2 illustrates a signal distribution trace and a clock stop pipeline formed in accordance with one embodiment of the invention.

FIG. 2 illustrates one embodiment of a signal distribution trace 40 in accordance with the invention. The signal distribution trace 40 is connected to a clock stop pipeline 50 constructed in accordance with one embodiment of the invention.

Figure 3:
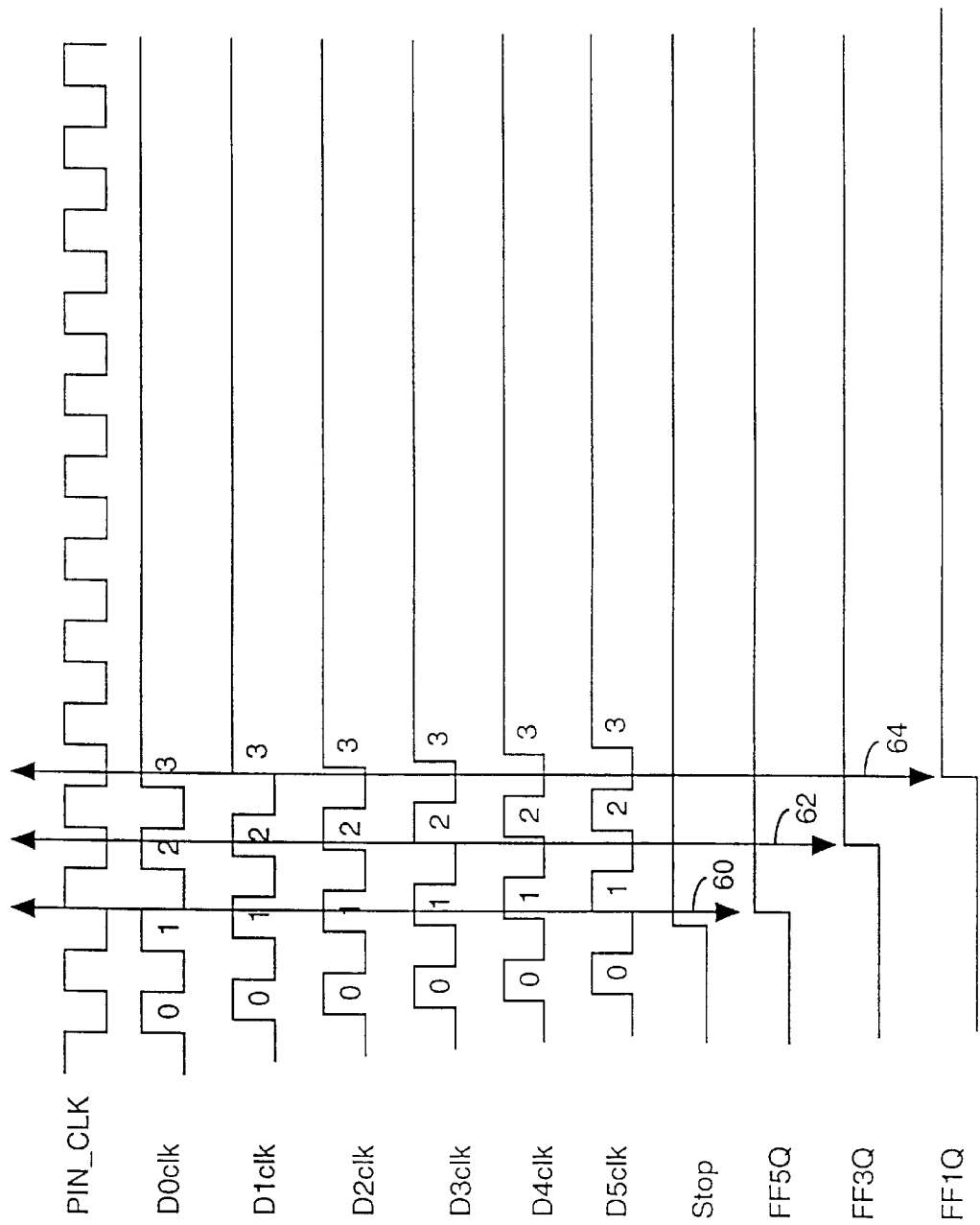
FIG. 3 is a timing diagram illustrating one embodiment of the invention.

The signal distribution trace 40 receives the PLL clock from the clock selection multiplexer 24. This clock signal is referred to as a zero delay clock signal D0clk. The signal distribution trace 40 includes a set of delay circuits 42A–42E. The delay circuits 42 cause signal propagation delays for the clock signal. This phenomenon is illustrated in reference to FIG. 3. FIG. 3 illustrates a set of timing signals. The first signal (PIN_CLK) is equivalent to the reference clock into the PLL 30. The second signal D0clk is the signal from the clock selection multiplexer 24 that is applied to the input node of the signal distribution trace 40.

The first delay circuit 42A, which may be implemented as a buffer, produces a small phase delay signal D1clk, which is shown in FIG. 3. Delay circuit 42B causes an additional phase delay as shown by the D2clk signal in FIG. 3. The phase delay circuit 42C results in a further delayed signal D3clk, shown in FIG. 3. The D3clk signal can be referred to as an intermediate phase delay signal. Similar phase delays are caused by the delay circuits 42D and 42E, resulting in the signals D4clk and D5clk, shown in FIG. 3. Note that the D5clk signal at the output node of the signal distribution trace 40 is a large phase delay signal. As shown by arrow 60 in FIG. 3, there is a one-half cycle phase delay between the D0clk signal and the D5clk signal. That is, the D0clk experiences a high-to-low transition as the D5clk experiences a low-to-high transition.

The large phase delay signal D5clk is equivalent to the PLL feedback signal shown in FIG. 1. This large phase delay signal is substantially equivalent to the signal that is applied to the logic elements in the signal distribution network 22. That is, the logic elements in the signal distribution network 22 also receive a phase delayed signal due to various signal propagation delays. The signal distribution trace 40 of the invention is constructed to replicate the phase delay signal that is received by the logical elements in the signal distribution network 22.

The signal distribution trace 40 includes a set of tap-off nodes 44A, 44B, and 44C. The final tap-off node 44C is at the output node of the signal distribution trace 40. The first tap-off node 44A is after the first delay circuit 42A, and the intermediate tap-off node 44B is after the delay circuit 42C. The purpose of the tap-off nodes is to tap subsequent clock cycles (clock cycles after the first clock cycle to trigger the clock stop pipeline 50) so that they can be used to enable different circuit components in the clock stop pipeline 50. Thus, as will be described in detail below, an intermediate stop clock instruction moves through the stop pipeline 50 in response to tapped subsequent clock cycles. Note that the tapped subsequent clock cycles move from left-to-right through the signal distribution trace 40. In contrast, the intermediate stop clock instruction moves through the clock stop pipeline 50 in an opposite direction.

The opposing movement between the clock signals of the signal distribution trace 40 and the intermediate stop clock instruction of the clock stop pipeline is appreciated with reference to FIG. 3. FIG. 3 shows a stop instruction being activated with a low-to-high signal transition. The manner in which the stop instruction is generated is not important. It may be generated using any number of techniques, including the use of an external pin of the integrated circuit internal logic or through a signal from the IEEE 1149 control logic 28.

The stop instruction is applied to the clock stop pipeline 50, as shown in FIG. 2. The stop signal is routed to the input of a first circuit component, implemented as a flip-flop identified as FF5. The stop signal is routed through a clock rate multiplexer 52 which is responsive to a clock selection signal (s_clk_mode), which will be discussed below.

The flip-flop FF5 receives the stop signal at its D input and the large phase delay signal of a first clock cycle from the signal distribution trace 40. This causes the Q output of the flip-flop FF5 to go high, producing an intermediate stop instruction. This operation is shown by arrow 60 in FIG. 3. Note in FIG. 3 that the stop signal is high when the D5clk signal goes from low-to-high. This causes the FF5Q signal to go from low-to-high.

Thus, at this point, a stop command has been generated. The stop command does not immediately stop the internal clock. Suppose that a circuit debugging specification stipulated that the internal clock of the integrated circuit must be stopped at a digital HIGH level. When the large phase delay signal of a first clock cycle, the D5clk signal, is received at all of the logic of the signal distribution network 22, including the logic of the clock stop pipeline 50, the D5clk is high (digital ONE) and the D0clk is low (digital ZERO). In this case, if the stop command were immediately processed, the clock selection multiplexer 24 would switch from the digital LOW D0clk to the digital HIGH stop state. This signal transition effectively clips a signal cycle. Thus, the clipped signal cycle can generate erroneous values in the signal distribution network. As a result, it is difficult to proceed with circuit debug operations.

The present invention avoids this situation by insuring that the stop state of the clock is established without a signal transition. For example, if the stop state is to be a digital HIGH signal, then the stop state will be initiated during a digital HIGH clock cycle. This condition is insured through the use of the signal distribution trace 40 and the clock stop pipeline 50 of the invention.

The original stop instruction applied to the clock stop pipeline 50 is processed such that it becomes coordinated with subsequent clock cycles. In this way, it can be insured that the stop instruction is processed during a selected transition state of a subsequent clock cycle.

The coordination between the stop instruction and subsequent signal cycles can be illustrated as follows. Note that the intermediate stop instruction generated by the flip-flop FF5 is a digital HIGH signal that is applied to an intermediate flip-flop FF3. This digital HIGH signal is not passed to the next stage of the clock stop pipeline 50 until an intermediate phase delay signal of a subsequent clock cycle, in this case the D3clk signal, is received at the flip-flop FF3. This processing is appreciated with reference to arrow 62 in FIG. 3. Note that the Q output of flip-flop FF3 goes high when a subsequent cycle "2" of the D3clk goes high.

The flip-flop FF3 produces another intermediate stop instruction that is applied to the final circuit component, flip-flop FF1 in this case. The final stop instruction generated by FF1 is produced when the intermediate stop instruction is received at the flip-flop and the small phase delay signal (D1clk) of a subsequent cycle "3" goes high, as shown by arrow 64 in FIG. 3. Note at this point that the D0clk is in a digital HIGH state.

The final stop instruction is processed by signal selection logic 54. The signal selection logic 54 recognizes the final stop instruction and generates a multiplexer selection signal that results in the clock selection multiplexer 24 selecting the constant digital HIGH clock stop signal ("1"), as shown in FIG. 1. Naturally, if the relevant circuit debugging specification stipulated that the clock was to be stopped on a digital LOW signal, a digital LOW clock stop signal would be used and different timing would be employed.

Returning to FIG. 3, note that the D0clk is in a digital HIGH state when a digital HIGH subsequent clock cycle "3" is received at the final circuit component FF1. The final stop instruction produced by the final circuit component FF1 is processed by the signal selection logic 54, resulting in a static digital HIGH clock stop signal, as shown in FIG. 3. The static digital HIGH clock stop signal is established during a digital HIGH state of the D0clk. Thus, there is no clock signal clipping that can result in erroneous data, as might otherwise occur in the absence of this invention.

The present invention deterministicly establishes a static digital HIGH (LOW) clock stop signal during an existing digital HIGH (LOW) clock signal as long as the following timing conditions are met:

(a) $\Delta_{T1}+T_{c2q}>T_{hold}$
(b) $\Delta_{T2}+T_{c2q}>T_{hold}$
(c) $T_{cycle}>\Delta_{T1}+T_{c2q}+T_{setup}$
(d) $T_{cycle}>\Delta_{T2}+T_{c2q}+T_{setup}$
(e) $T_{cycle}/2>\Delta_{T3}+T_{c2q}+T_{logic}+T_{mux}$ where $\Delta_{T1}$ is the time difference between the large phase delay signal (D5clk) and the intermediate phase delay signal (D3clk), $\Delta_{T2}$ is the time difference between the intermediate phase delay signal (D3clk) and the small phase delay signal (D1clk), $\Delta_{T3}$ is the time difference between the small phase delay signal (D1clk) and an input integrated circuit internal clock signal (D0clk), $T_{setup}$ is the setup time for each flip-flop, $T_{hold}$ is the hold time for each flip-flop, $T_{c2q}$ is the clock to Q time for each flip-flop, and $T_{cycle}$ is the cycle time of the integrated circuit internal clock.

Returning to FIG. 2, an optional preliminary circuit component FF5* is shown. This circuit component may be inserted into the clock stop pipeline 50 if an additional delay element is desirable. For example, the additional delay element may be desirable if the internal clock is to operate at twice the frequency of the external clock. The clock rate multiplexer 52 may be operated such that a stop command is first processed by the flip-flop FF5* in a first cycle, with the output of the flip-flop FF5* being passed through the clock rate multiplexer 52 in a second cycle.

A variety of obvious modifications of the disclosed embodiments may be used in accordance with the invention. For example, the circuit components of the clock stop pipeline 50 need not be implemented as flip-flops. A variety of circuit component configurations may be used in the clock stop pipeline 50 to obtain the timing results desired. In any embodiment, the primary control theme is to coordinate the intermediate stop instruction with subsequent clock cycles to insure a uniform transition to a final clock stop state.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. A control circuit to stop an integrated circuit internal clock, comprising:

a signal distribution trace creating
a large phase delay signal for a first integrated circuit internal clock cycle, and
a small phase delay signal for a final integrated circuit internal clock cycle; and a clock stop pipeline connected to said signal distribution trace, said clock stop pipeline including
a first circuit component to generate an intermediate stop instruction in response to a clock stop command and said large phase delay signal of said first integrated circuit internal clock cycle, and
a final circuit component to produce a final stop instruction in response to said intermediate stop instruction and said small phase delay signal of said final integrated circuit internal clock cycle.

2. The control circuit of claim 1 wherein said signal distribution trace creates an intermediate phase delay signal for an intermediate integrated circuit internal clock cycle.

3. The control circuit of claim 2 wherein said signal distribution trace includes a first delay circuit to generate said small phase delay signal, said first delay circuit and a second delay circuit to generate said intermediate phase delay signal, and said first delay circuit, said second delay circuit, and a third delay circuit to generate said large phase delay signal.

4. The control circuit of claim 3 further comprising at least one intermediate circuit component positioned between said first circuit component and said final circuit component.

5. The control circuit of claim 4 wherein said first circuit component is connected to said third delay circuit to processes said large phase delay signal, said intermediate circuit component is connected to said second delay circuit to process said intermediate phase delay signal, and said final circuit component is connected to said first delay circuit to process said small phase delay signal.

6. The control circuit of claim 5 further comprising a preliminary circuit component to process said small phase delay signal and generate an output signal that is applied to said first circuit component such that said first circuit component generates said intermediate stop instruction.

7. The control circuit of claim 6 further comprising a clock rate multiplexer positioned between said preliminary circuit component and said first circuit component, said clock rate multiplexer selectively activating either said preliminary circuit component or said first circuit component.

8. The control circuit of claim 5 wherein said first circuit component, said intermediate circuit component, and said final circuit component are each implemented as a flip-flop.

9. The control circuit of claim 8 wherein said clock stop pipeline observes the following timing relationships:

(a) $\Delta_{T1}+T_{c2q}>T_{hold}$
(b) $\Delta_{T2}+T_{c2q}>T_{hold}$
(c) $T_{cycle}>\Delta_{T1}+T_{c2q}+T_{setup}$
(d) $T_{cycle}>\Delta_{T2}+T_{c2q}+T_{setup}$
(e) $T_{cycle}/2>\Delta_{T3}+T_{c2q}+T_{logic}+T_{mux}$ where $\Delta_{T1}$ is the time difference between said large phase delay signal and said intermediate phase delay signal, $\Delta_{T2}$ is the time difference between said intermediate phase delay signal and said small phase delay signal, $\Delta_{T3}$ is the time difference between said small phase delay signal and an input integrated circuit internal clock signal from which said small phase delay signal is generated, $T_{setup}$ is the setup time for each of said flip-flops, $T_{hold}$ is the hold time for each of said flip-flops, $T_{c2q}$ is the clock to Q time for each of said flip-flops, and $T_{cycle}$ is the cycle time of said integrated circuit internal clock.

10. The control circuit of claim 1 further comprising signal selection logic to process said final stop instruction and generate a multiplexer selection signal.

11. The control circuit of claim 10 further comprising a clock selection multiplexer connected to said signal selection logic and produce a selected clock output signal in response to said multiplexer selection signal.

12. The control circuit of claim 11 further comprising an IEEE 1149 control logic circuit connected to said clock selection multiplexer.

13. A method of stopping an integrated circuit internal clock, said method comprising the steps of:

applying an integrated circuit internal clock to a signal distribution trace;

generating a clock stop command;

activating a clock stop pipeline with said clock stop command and a selected cycle of said integrated circuit internal clock; and propagating said clock stop command through said clock stop pipeline in response to subsequent cycles of said integrated circuit internal clock, such that a subsequent cycle of said integrated circuit internal clock is used to stop said integrated circuit internal clock in a predetermined clock state.

14. The method of claim 13 wherein said applying step results in a zero delay clock signal at the input node of said signal distribution trace and a delayed clock signal at the output node of said signal distribution trace, said delayed clock signal being used for said selected cycle during said activating step.

15. The method of claim 14 wherein said zero delay clock signal and said delayed clock signal have a phase displacement of at least one-half cycle.

16. The method of claim 13 wherein said activating step includes the step of activating a first circuit element of said clock stop pipeline with said clock stop command and said selected cycle of said integrated circuit internal clock.

17. The method of claim 16 wherein said propagating step includes the step of using a selected subsequent cycle of said integrated circuit internal clock, delayed by a first delay period, to activate an intermediate circuit element of said clock stop pipeline positioned in front of said first circuit element.

18. The method of claim 17 wherein said propagating step includes the step of using a final subsequent cycle of said integrated circuit internal clock, delayed by a second delay period shorter than said first delay period, to activate a final circuit element of said clock stop pipeline positioned in front of said intermediate circuit element.

19. The method of claim 18 wherein said predetermined clock state corresponds to the clock state of said final subsequent cycle of said integrated circuit internal clock.

* * * * *